United States Patent
Zhang et al.

(10) Patent No.: US 12,394,490 B2
(45) Date of Patent: Aug. 19, 2025

(54) PV DISTRIBUTION VARIATION DETECTION AND DATA RECLAIM POLICY

(71) Applicant: SK hynix Inc., Gyeonggi-do (KR)

(72) Inventors: Fan Zhang, San Jose, CA (US); Meysam Asadi, San Jose, CA (US)

(73) Assignee: SK hynix Inc., Gyeonggi-do (KR)

(*) Notice: Subject to any disclaimer, the term of this patent is extended or adjusted under 35 U.S.C. 154(b) by 181 days.

(21) Appl. No.: 18/314,568

(22) Filed: May 9, 2023

(65) Prior Publication Data

US 2024/0379166 A1    Nov. 14, 2024

(51) Int. Cl.
G11C 16/12 (2006.01)
G11C 11/56 (2006.01)
G11C 16/30 (2006.01)

(52) U.S. Cl.
CPC .......... *G11C 16/12* (2013.01); *G11C 11/5628* (2013.01); *G11C 16/30* (2013.01)

(58) Field of Classification Search
CPC ...... G11C 16/12; G11C 11/5628; G11C 16/30
See application file for complete search history.

(56) References Cited

U.S. PATENT DOCUMENTS

| | | | |
|---|---|---|---|
| 11,322,214 B1 | 5/2022 | Zhang et al. | |
| 2022/0012124 A1* | 1/2022 | Zhang | G11C 11/5642 |
| 2022/0091953 A1 | 3/2022 | Asadi et al. | |

* cited by examiner

*Primary Examiner* — Xiaochun L Chen
(74) *Attorney, Agent, or Firm* — IP & T GROUP LLP

(57) ABSTRACT

A memory system and method for data reclaim which reads data from a memory using a preset voltage threshold based on a page type being read; records an initial set of program voltages for successful reads of the data from the memory; determines an initial distribution of the initial set of program voltages, over time subsequent sets of the program voltages for successful reads of the data from the memory; determines subsequent distributions of the subsequent sets of the program voltages; and based on program voltage variations of the subsequent distributions from the initial deviation, recycles the data in the memory.

20 Claims, 8 Drawing Sheets

WL variation

TLC Reliability Requirements

| Requirement (Case IV) | Available Read | Failure Rate |
|---|---|---|
| Requirement 1 | Block Best Read Reference | 0.0001 |
| Requirement 2 | Block Best RR + HRR[(2)]-1 | 0.00001 |
| Requirement 3 | Block Best RR + HRR[(2)]-1,2 | 0.000001 |
| Requirement 4 | Block Best RR + HRR[(2)]-1,2,3 | 0.0000001[(3)] |

| Latency CDF | Read Qos (μs) |
|---|---|
| 50% | 90 |
| 99.9% | 120 |
| 99.99% | 150 |
| 99.999% | 150 |
| 99.9999% | 200 |
| 99.99999% | 500 |

PV DISTRIBUTION VARIATION DETECTION AND DATA RECLAIM POLICY

BACKGROUND

1. Field

Embodiments of the present disclosure relate to a memory system for monitoring hard error occurrences.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

The SSD may include flash memory components and a controller, which includes the electronics that bridge the flash memory components to the SSD input/output (I/O) interfaces. The SSD controller may include an embedded processor that executes functional components such as firmware. The SSD functional components are typically device specific, and in most cases, can be updated.

The two main types of flash memories are named after the NAND and NOR logic gates. The individual flash memory cells exhibit internal characteristics similar to those of their corresponding gates. The NAND-type flash memory may be written to and read from in blocks (or pages) which are generally much smaller than the entire memory space. The NOR-type flash memory allows a single machine word (byte) to be written to an erased location or read independently. The NAND-type flash memory operates primarily in memory cards, USB flash drives, solid-state drives (SSDs), and similar products, for general storage and transfer of data.

There are two kinds of errors in data (words) stored in a memory. One is a temporary error, such as a soft error, which can be corrected in the memory by writing back (rewriting) the corrected data. The other is a hard error which cannot be corrected in the memory by rewriting the corrected data. A hard error may occur because of a faulty cell in the memory (e.g., a cell is stuck at "1" or "0"). In the case of a hard error, an error occurs every time that the bad bit is accessed.

SUMMARY

In one embodiment of the present invention, there is provided a memory system for data reclaim. The memory system has a memory and a memory controller in communication with the memory. The memory controller is configured to read data from the memory using a preset voltage threshold based on a page type being read; record an initial set of program voltages for successful reads of the data from the memory; determine an initial distribution of the initial set of program voltages; record over time subsequent sets of the program voltages for successful reads of the data from the memory; determine subsequent distributions of the subsequent sets of the program voltages; and based on program voltage variations of the subsequent distributions from the initial deviation, recycle the data in the memory In one embodiment of the present invention, there is provided a method for data reclaim from a memory system. The method reads data from a memory using a preset voltage threshold based on a page type being read; records an initial set of program voltages for successful reads of the data from the memory; determines an initial distribution of the initial set of program voltages, over time subsequent sets of the program voltages for successful reads of the data from the memory; determines subsequent distributions of the subsequent sets of the program voltages; and based on program voltage variations of the subsequent distributions from the initial deviation, recycles the data in the memory.

Additional aspects of the present invention will become apparent from the following description.

DETAILED DESCRIPTION

Figure 1:
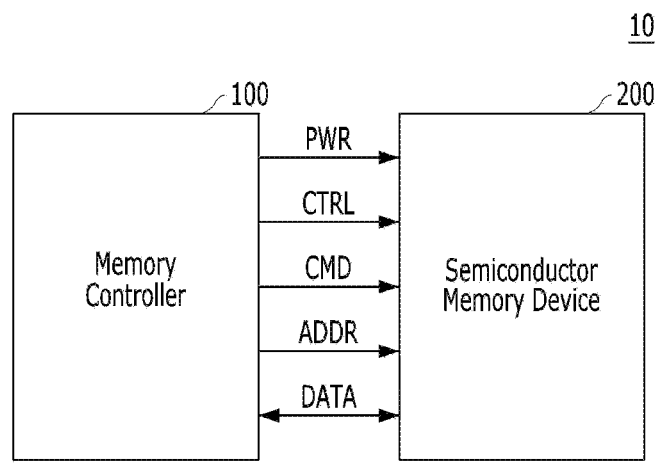
FIG. 1 is a block diagram illustrating a memory system in accordance with one embodiment of the present invention.

Various embodiments are described below in more detail with reference to the accompanying drawings. The present invention may, however, be embodied in different forms and thus should not be construed as limited to the embodiments set forth herein. Rather, these embodiments are provided so that this conveys the scope of the present invention to those skilled in the art. Moreover, reference herein to "an embodiment," "another embodiment," or the like is not necessarily to only one embodiment, and different references to any such phrases are not necessarily to the same embodiment(s). Throughout the disclosure, like reference numerals refer to like parts in the figures and embodiments of the present invention.

The invention can be implemented in numerous ways, including as a process; an apparatus; a system; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The invention encompasses numerous alternatives, modifications and equivalents to the disclosed embodiments. Numerous specific details are set forth in the following description in order to provide a thorough understanding of the invention. These details are provided for the purpose of example; the invention may be practiced without some or all of these specific details. For clarity, technical material that is known in technical fields related to the invention has not been described in detail so that the invention is not unnecessarily obscured.

FIG. 1 is a block diagram schematically illustrating a memory system in accordance with one embodiment of the present invention.

Referring to FIG. 1, the memory system 10 may include a memory controller 100 and a semiconductor memory device 200, which may represent more than one such device. The semiconductor memory device(s) 200 may be flash memory device(s), particularly of the NAND-type.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output (I/O) lines. The semiconductor memory device 200 may receive power PWR through a power line and a control signal CTRL through a control line. The control signal CTRL may include a command latch enable (CLE) signal, an address latch enable (ALE) signal, a chip enable (CE) signal, a write enable (WE) signal, a read enable (RE) signal, and the like.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

In another embodiment, the memory system 10 may be provided as one of various components in an electronic device such as for example a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

Figure 2:
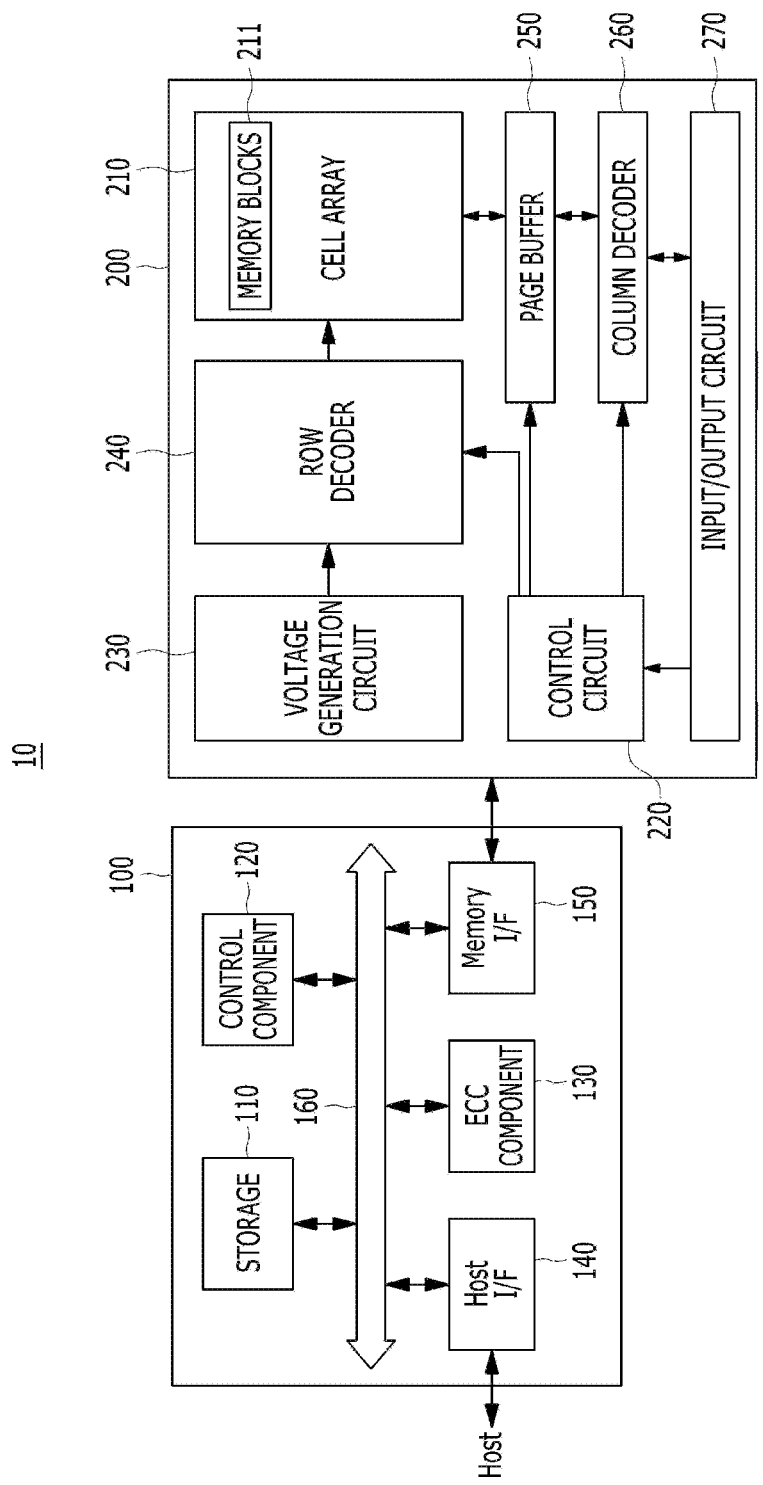
FIG. 2 is a block diagram illustrating a memory system in accordance with another embodiment of the present invention.

FIG. 2 is a detailed block diagram illustrating a memory system in accordance with another embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as for example a desktop computer, a workstation, a three-dimensional (3D) television, a smart television, a digital audio recorder, a digital audio player, a digital picture recorder, a digital picture player, and/or a digital video recorder and a digital video player. In some embodiments, the host device may include a portable electronic device such as for example a mobile phone, a smart phone, an e-book, an MP3 player, a portable multimedia player (PMP), and/or a portable game player.

The memory device 200 may store data to be accessed by the host device.

The memory device 200 may be implemented with a volatile memory device such as for example a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and write and read operations for the memory device 200, in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In some embodiments, the ECC component 130 may perform an error correction operation based on coded modulation techniques such as for example a low-density parity-check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a block coded modulation (BCM). As such, the ECC component 130 may include circuits, systems or devices for suitable error correction operation. In particular, the ECC component 130 may include an encoder and an LDPC decoder, e.g., a single LDPC chip-kill decoder.

The host interface 140 may communicate with the host device through one or more of various interface protocols such as for example a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component 120. When the memory device 200 is a flash memory such as a NAND flash memory, the memory interface 150 may generate control signals for the memory and process data under the control of the control component 120.

The memory device 200 may include a memory cell array 210, a control circuit 220, a voltage generation circuit 230, a row decoder 240, a page buffer 250, which may be in the form of an array of page buffers, a column decoder 260, and an input/output circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as erase and pass voltages.

The row decoder 240 may be in electrical communication with the voltage generation circuit 230, and the plurality of memory blocks 211. The row decoder 240 may select at least one memory block among the plurality of memory blocks 211 in response to a row address generated by the control circuit 220, and transmit operation voltages supplied from the voltage generation circuit 230 to the selected memory blocks.

Figure 3:
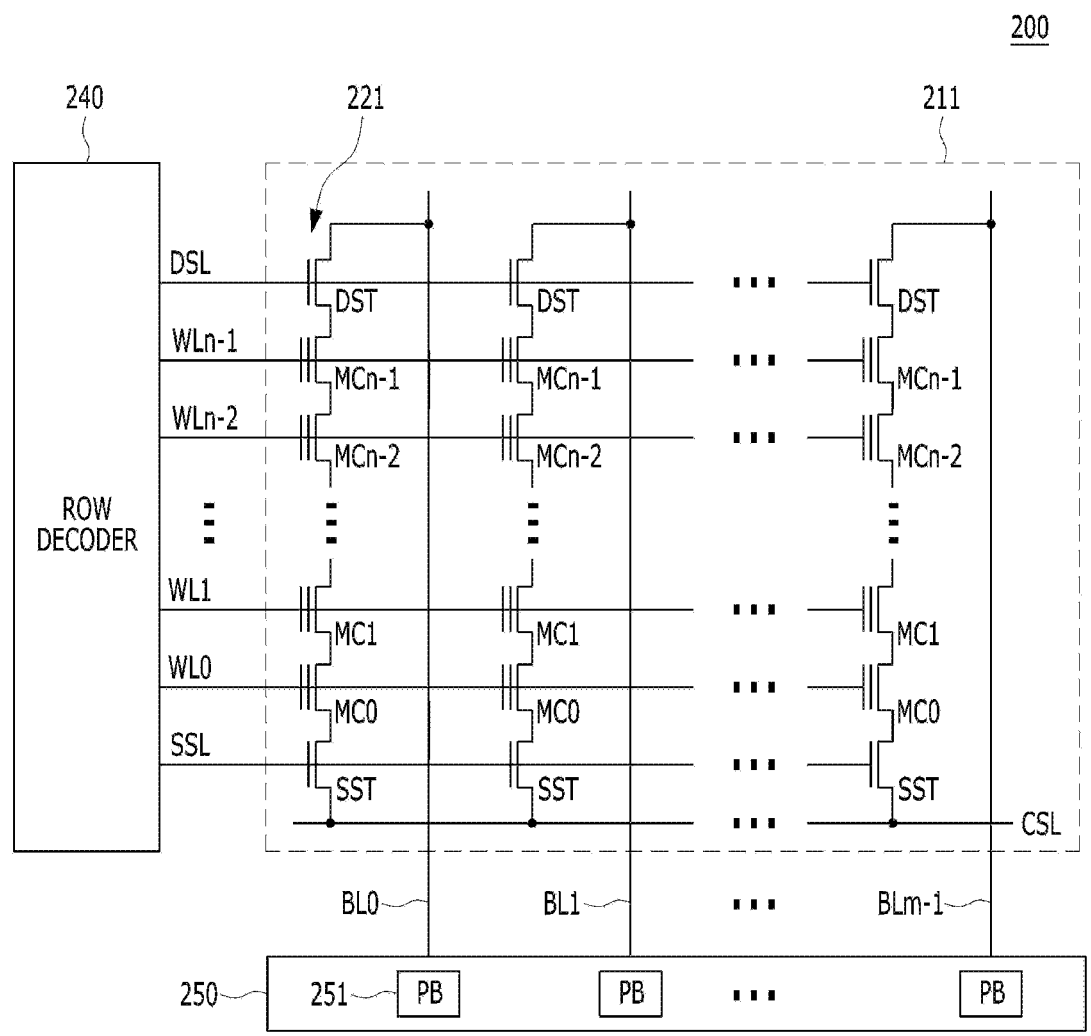
FIG. 3 is a circuit diagram illustrating a memory block of a memory device of a memory system in accordance with still another embodiment of the present invention.

The page buffer 250 may be in electrical communication with the memory cell array 210 through bit lines BL (shown in FIG. 3). The page buffer 250 may pre-charge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250, and may also exchange data with the input/output circuit 270.

The input/output circuit 270 may transmit to the control circuit 220 a command and an address, received from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with another embodiment of the present invention. For example, the memory block of FIG. 3 may be any of the memory blocks 211 of the memory cell array 200 shown in FIG. 2.

Referring to FIG. 3, the exemplary memory block 211 may include a plurality of word lines WL0 to WLn-1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to BLm-1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn-1 may be serially coupled between the selection transistors DST and SST. Each of the memory cells may be formed as a multi-level cell (MLC) storing data information of multiple bits.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer 250 may include a plurality of separate page buffers PB 251 that are coupled to the bit lines BL0 to BLm-1. The page buffers PB 251 may operate in response to page buffer control signals. For example, the page buffers PB 251 my temporarily store data received through the bit lines BL0 to BLm-1 or sense voltages or currents of the bit lines during a read or verify operation.

In various embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

Figure 4:
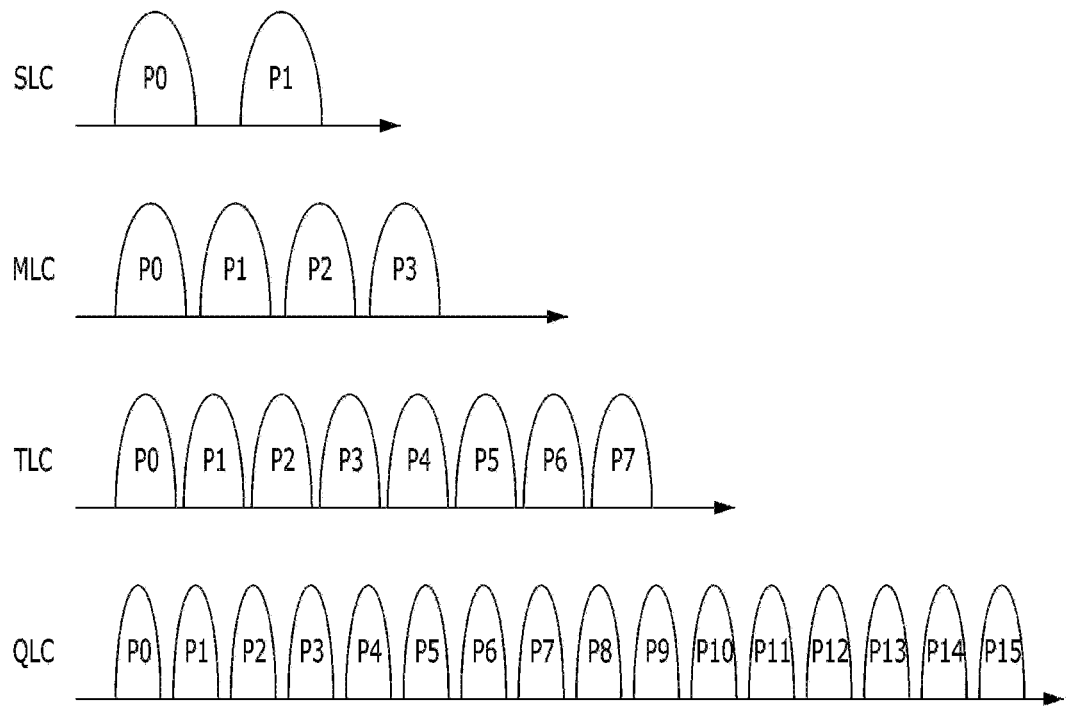
FIG. 4 is a diagram illustrating distributions of states for different types of cells of a memory device.

FIG. 4 is a diagram illustrating distributions of states or PV levels for different types of cells of a memory device.

Each memory cell may be implemented with a specific type of cell, for example, a single level cell (SLC) storing 1 bit of data, a multi-level cell (MLC) storing 2 bits of data, a triple-level cell (TLC) storing 3 bits of data, or a quadruple-level cell (QLC) storing 4 bits of data or a penta-level cell (PLC) soring 5 bits of data. Usually, all memory cells in a particular memory device are of the same type, but that is not a requirement. FIG. 4 shows the states for MLC, TLC, and QLC types of cells.

An SLC may include two states P0 and P1. P0 may indicate an erase state, and P1 may indicate a program state. Since the SLC can be set in one of two different states, each SLC may program or store 1 bit according to a set coding method. An MLC may include four states P0, P1, P2 and P3. Among these states, P0 may indicate an erase state, and P1 to P3 may indicate program states. Since the MLC can be set in one of four different states, each MLC may program or store two bits according to a set coding method. A TLC may include eight states P0 to P7. Among these states, P0 may indicate an erase state, and P1 to P7 may indicate program states. Since the TLC can be set in one of eight different states, each TLC may program or store three bits according to a set coding method. A QLC may include 16 states P0 to P15. Among these states, P0 may indicate an erase state, and P1 to P15 may indicate program states. Since the QLC can be set in one of sixteen different states, each QLC may program or store four bits according to a set coding method.

Figure 5:
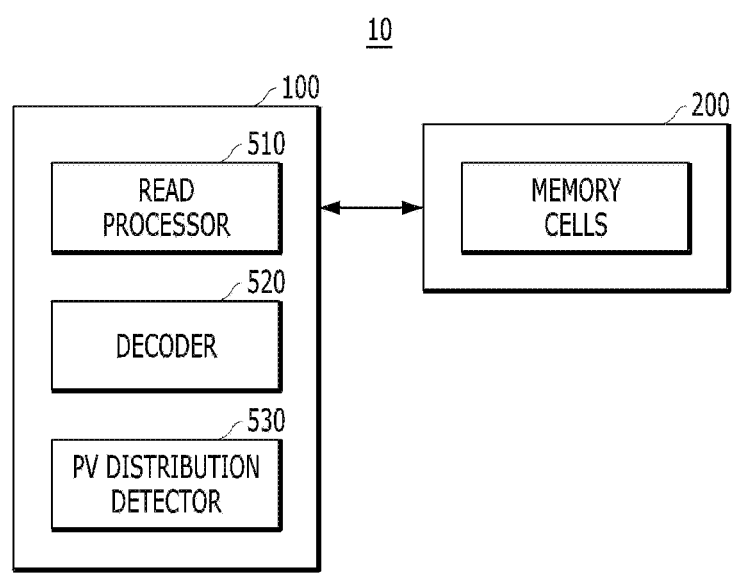
FIG. 5 is a diagram illustrating a memory system in accordance with one embodiment of the present invention.

FIG. 5 is a diagram illustrating a memory system 10 in accordance with an embodiment of the present invention.

Referring to FIG. 5, the memory system 10 may include a controller 100 and a memory device 200. The memory device 200 may include a plurality of memory cells (e.g., NAND flash memory cells). The memory cells are arranged in an array of rows and columns as shown in FIG. 3. The cells in each row are connected to a word line (e.g., WL0), while the cells in each column are coupled to a bit line (e.g., BL0). These word and bit lines are used for read and write operations. During a write operation, the data to be written ('1'or '0') is provided at the bit line while the word line is asserted. During a read operation, the word line is again asserted, and the threshold voltage of each cell can then be acquired from the bit line. Multiple pages may share the memory cells that are coupled to the same word line. When the memory cells are implemented with MLCs, the multiple pages include a most significant bit (MSB) page and a least significant bit (LSB) page. When the memory cells are implemented with TLCs, the multiple pages include an MSB page, a center significant bit (CSB) page and an LSB page. When the memory cells are implemented with QLCs, the multiple pages include an MSB page, a center most significant bit (CMSB) page, a center least significant bit (CLSB) page and an LSB page. The memory cells may be programmed using a coding scheme (e.g., Gray coding) in order to increase the capacity of the memory system 10 such as an SSD.

Figure 6:
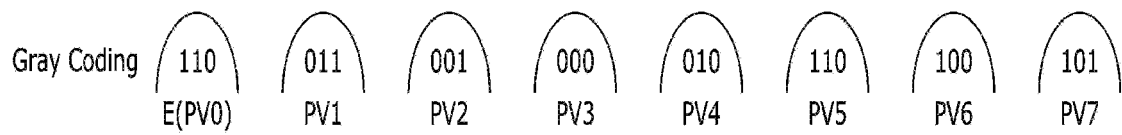
FIG. 6 is a diagram illustrating an example of Gray coding for a triple level cell (TLC).

FIG. 6 is a diagram illustrating an example of Gray coding for a triple level cell (TLC).

Referring to FIG. 6, a TLC may be programmed using Gray coding. As described above, a TLC may have 8 program states, which include an erased state E (or PV0) and first to seventh program states PV1 to PV7. The erased state E (or PV0) may correspond to "110." The first program state PV1 may correspond to "011." The second program state PV2 may correspond to "001." The third program state PV3 may correspond to "000." The fourth program state PV4 may correspond to "010." The fifth program state PV5 may correspond to "110." The sixth program state PV6 may correspond to "100." The seventh program state PV7 may correspond to "101."

Figure 7:
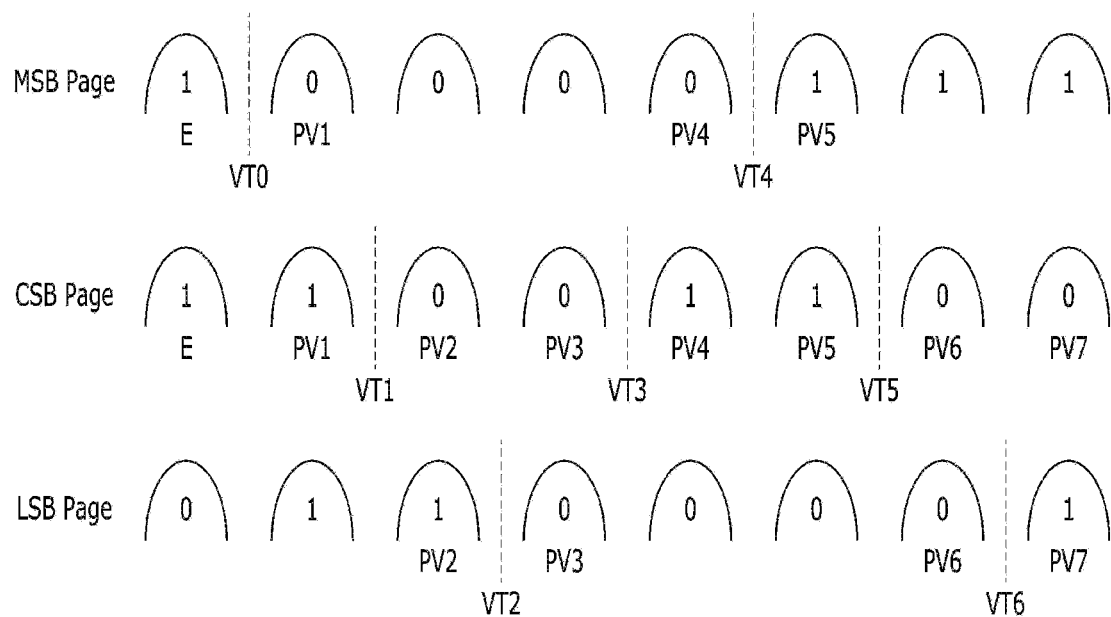
FIG. 7 is a diagram illustrating state distributions for pages of a triple level cell (TLC) in accordance with yet another embodiment of the present invention.

In a TLC, as shown in FIG. 7, there are 3 types of pages including LSB, CSB and MSB pages. 2 or 3 thresholds may be applied in order to retrieve data from the TLC. For an MSB page, 2 thresholds include a first threshold value VT0 and a second threshold value VT4. The first threshold value VT0 distinguishes between an erase state E and a first program state PV1. The second threshold value VT4 distinguishes between a fourth program state PV4 and a fifth program state PV5. For a CSB page, 3 thresholds include a first threshold value VT1, a second threshold value VT3 and a third threshold value VT5. The first threshold value VT1 distinguishes between a first program state PV1 and a second program state PV2. The second threshold value VT3 distinguishes between a third program state PV3 and the fourth program state PV4. The third threshold value VT5 distinguishes between the fifth program state PV5 and the sixth program state PV6. For an LSB page, 2 thresholds include a first threshold value VT2 and a second threshold value VT6. The first threshold value VT2 distinguishes between the second program state PV2 and the third program state PV3. The second threshold value VT6 distinguishes between the sixth program state PV6 and a seventh program state PV7.

Referring back to FIG. 5, the controller 100 may include a read processor 510, a decoder 520 and a PV distribution detector 530. These components may be implemented by the control component 120 or internal components thereof, i.e., firmware (FW) in FIG. 2. Although not shown in FIG. 5, the controller 100 and the memory device 200 may include various other components as shown in FIG. 2.

The read processor 510 may control read operations for the memory device 200 in response to a read request from a host (e.g., the host 5 of FIG. 1). The read processor 510 may control the read operations based on various read thresholds. The decoder 520 may decode data associated with the read operations.

In various embodiments, the read processor 510 may control a read operation for the memory cells using a select read threshold from a set read level table. In some embodiments, the read level table may include multiple read thresholds and the select read threshold may include a default read threshold. When the read operation is performed for the MSB page of TLC, the select read threshold may include a pair of first and second read thresholds [VT0, VT4] as shown in FIG. 7. The first read threshold value VT0 is used to distinguish between an erase state (i.e., E) and a first program state (i.e., PV1), and the second read threshold value VT4 is used to distinguish between a fourth program state (i.e., PV4) and a fifth program state (i.e., PV5). When the read operation is performed for the LSB page of TLC, the select read threshold may include a pair of first and second read thresholds [VT2, VT6] as shown in FIG. 7. The first read threshold value VT2 is used to distinguish between a second program state (i.e., PV2) and a third program state (i.e., PV3), and the second read threshold value VT6 is used to distinguish between a sixth program state (i.e., PV6) and a seventh program state (i.e., PV7).

It may be determined whether the read operation using a read threshold selected from a read threshold set succeeded or failed, depending on the decoding result of the decoder 520. When the read operation using the selected read threshold failed, the read processor 510 may control one or more read retry operations for the memory cells using a read retry threshold. In some embodiments, the read retry may involve performing five (5) different read attempts with different and/or static read threshold settings.

Typically, memory cells of the memory device 200 gradually wear out due to program-erase (P/E) cycles, and default read thresholds are not optimal for all retention and read disturb conditions. When the number of bit errors in a page to be read exceeds the correction capability of an error correction scheme (i.e., error correction code (ECC) correction capability) in a decoder, additional read attempts for data recovery are required to decode the page successfully with different read threshold biases. The first two steps in the data recovery involve performing a historical read retry (HRR). Successful read thresholds associated with the last successful decoding are tracked and maintained in a set of historical read thresholds (HRT) and a historical read threshold is used in the first step in the additional read attempt. In case of a decoding failure after using a historical read threshold, several other read attempts (i.e., high priority reads or HRRs) are made.

PV Variations in SSD

In the same block or super block, a program voltage distribution on a different WL or a different WL group tends to be similar because the data stored therein experience similar read disturbance and retention such that the PV distributions are shifted in a similar direction and amount. As long as PV distributions are concentrated, using the right read bias taken from a historical read register can help compensate for the shift to make sure that decoding is successful. In some cases, when PV distributions in the same block or super block start to diverge from each other, a single read bias is not sufficient to make sure that the fail bit count is lower than a hard decoder's correction capability.

Furthermore, the read bias settings (taken from a historical read register) are now constantly being changed. The more variation there is in a PV distribution, then the higher the trigger rate will be for the entries in HRR to be used. Once any of the HRR entries is triggered and succeeds, the successful read voltage will be used to update the entries in the historical read register. Furthermore, when the PV distributions diverge from each other, frequent triggering of HRR entries will occur, and the historical read register will be updated frequently, leading to QoS requirement violations at low-9s.

In existing defense flow procedures, there is no way to address this situation. To prevent such a QoS violation, the inventive scheme detects an increasing PV distribution variation, and before occurrence of a QoS violation, a memory block experiencing a high PV distribution variation can be recycled. Such recycling may include re-writing read data to a new location in memory or re-writing data back to the same location in the memory cells. This operates to refresh the data such that errors due to time decay or cell decay are eliminated.

NAND Variation

Figures 8A, 8B:
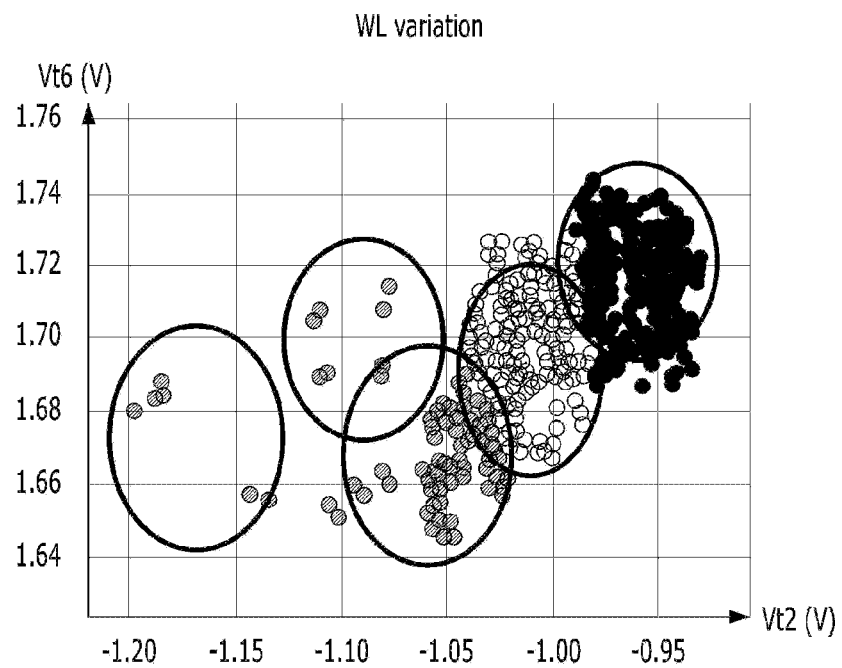
FIG. 8A is a schematic depicting variations in program voltages (PV) that develop over time in accordance with still another embodiment of the present invention.
FIG. 8B is a table showing an industrial quality of service (QOS) requirement in accordance with still another embodiment of the present invention.

FIG. 8A shows NAND data obtained by the inventors to explain the PV distribution variation within the lifetime of an SSD. In FIG. 8A, the word line variations shown are for a NAND generation S96 device with a program/erase cycling of 11000, a retention time of 30 days, and a read disturb occurrence of 1 million times. Each point on the plot shows the optimal read voltage threshold for one least significant bit LSB page. The circles group the LSB pages with similar read thresholds. FIG. 8A shows that the optimal read threshold for some of the pages is different from other pages, particularly for other pages having different word line variations. While it is difficult to visualize all PV distribution variations because such variations are high-dimensional (depending on many factors), the variation of the optimal Vt for all pages in a block together with the decoding radius (e.g., a circle or ellipse) is shown as one example of a PV distribution variation. In FIG. 8A, every point represents an LSB page's optimal Vt (for LSB, Vt2 and Vt6 are used as x and y axis, respectively).

Hence, every point represents (at some point in the lifetime of the NAND) a value of Vt2 and a value of Vt6 for successful voltage threshold reading data values of the LSB page. Each center of the circles is in effect an average of the entries for historical read voltages taken from a historical read register. Any point inside a circle can be successfully decoded by reading the page using the read bias in the center of the circle.

As evident from the data in FIG. 8A, at this time in the reading/writing data to the NAND, at least five (5) different read bias settings are needed to cover all LSB pages in the memory block. This contrasts with the read/write performance of newly made or newly programed NAND where (as noted above) the PV variations are concentrated such that only one read bias setting was needed to read all LSB pages in this memory block. For random read traffic being directed to different pages in the memory block, the voltages from the HRR will constantly fail, and some of the HRR entries will be constantly triggered and replaced former historical read setting. This failure and the constant replacing of the historical read setting causes a violation of QoS as in general voltages from HRR need to succeed with a higher than 99.999% probability of success in order not fail a typical QoS requirement.

An industrial QoS requirement for eSSD is shown in FIG. 8B. FIG. 8B shows the failure rates, latency cumulative probability distribution function (CDF), and the read QoS. From FIG. 8B, it is clear that for higher HRRs, the failure rate is reduced at the cost of higher latency (reduced bandwidth in the controller) and a higher required time for maintaining the QoS.

Detection of PV Distribution Variation

In one embodiment of the present invention, referring back to FIG. 5, the program voltage distribution detector 530 may detect, record, and track program voltage distributions over time where the successfully decoded host traffic is used to obtain the PV distribution variations.

In the beginning of life, or when a memory block is fresh (just opened), the PV distribution is concentrated, and any variations are small. Utilizing a historical read voltage will almost always be successful. The program voltage distribution detector 530 monitors the PV variations as the program erase cycle (PEC) and/or read disturb and/or retention increase, where the PV distributions in the same block shows greater variations. In the program voltage distribution detector 530, variations can be observed and measured by tracking a number of performance metrics such as identifying a spreading of the optimal voltages from a concentrated set into distributed sets, and the max and min of performance metrics reported from successful decoding. The metrics may include FBC, 13 s (0's) count, error count from 0 to 1 and error count from 1 to 0, decoding iterations, etc.

As an example, in the program voltage distribution detector 530, the following voltage variation can be quantitatively calculated by the equation below.

V=w0*(max(FBC)−min(FBC))+w1*(max(FBC(0to1)−min(FBC(0to1))+w2*(max(FBC(1to0))−min(FBC(1to0))+w3*(max(decoding iter)−min(decoding iter)), where V is the voltage variation, FBC is the failed bit count, w0, w1, w2, w3, etc. are the scaling factors, and "0to1" is the number of failed bits from value 0 to value 1 (0-->1).

In one embodiment of the present invention, the range for the scaling factors w0, w1, w2, w3, etc. can be selected in a way that one of these factors does not become dominant. One way is to select scaling factors so that the factors in range of [0, 1] are normalized. To do this, for example, the maximum value of the difference (max(FBC)−min(FBC)) is determined for a certain condition. Let say it is observed that the maximum value is always less than 1000. In this case, w0 can be set to 1/1000, which ensures the value 0 is less than or equal to w0*(max (FBC)−min(FBC)). Similarly, w1, w2, w3 can be set so that each factor max value is '1'. The present invention is not limited to this way of setting scaling factors w0, w1, w2, w3, etc. Nevertheless, in this case, for a maximum value for the voltage variation V of 4, the threshold variation value T can be set to '2'. That is the threshold variation value T can be set less than the calculated voltage variation.

In one embodiment of the invention, for every block/super block, the following quantities (performance metrics) can be tracked: max(FBC(0to1)), min(FBC(0to1)), max (FBC(1to0)), min(FBC(1to0)), max(FBC), min(FBC), max (decoding iter), min(decoding iter). Note that the total FBC is in general equal to FBC(0to1)+FBC(1to0).

In one embodiment of the present invention, once the variation V is higher than a predefined threshold variation value T, the chance of a QoS violation is high, and the program voltage distribution detector 530 may inform memory controller (such as memory controller 100) that a block/super block needs to be recycled.

Once a block is newly opened or there is a power on event, all the quantities (or performance metrics being monitored can be reset, for example: max(FBC(0to1))=0, min(FBC(0to1))=9999, max(FBC(1to0))=0, min(FBC (1to0))=9999, max(FBC)=0, min(FBC)=9999, max(decoding iter)=0, min(decoding iter)=9999.

In one embodiment of the present invention, when there is a power off, the present values of the performance metrics need not be saved to the NAND.

Variation Detection and Reclaim Processing

Figure 9:
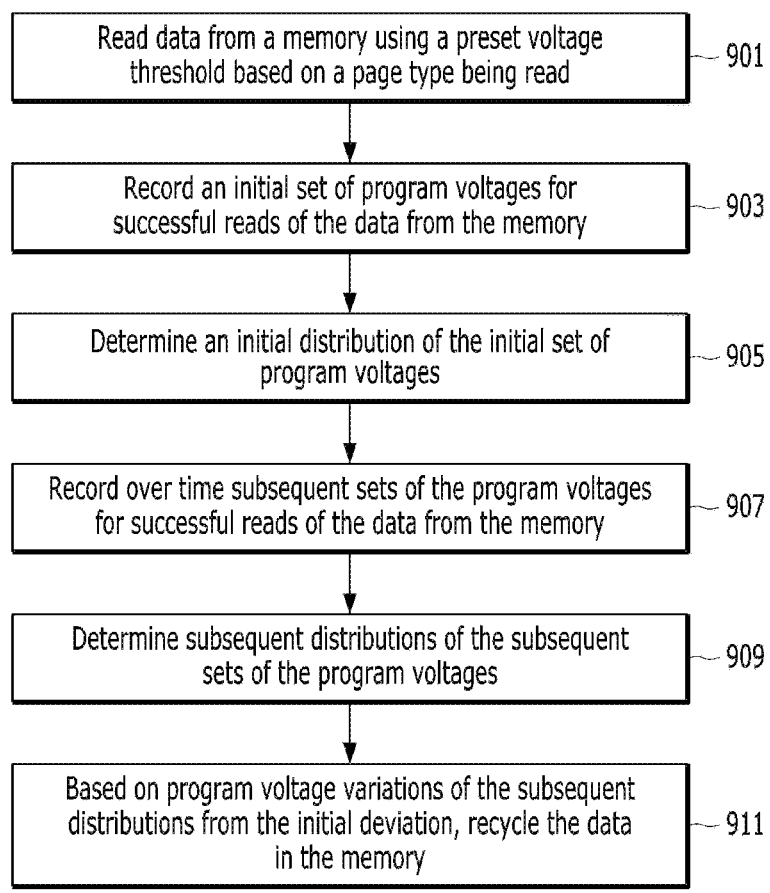
FIG. 9 is a flowchart depicting an exemplary method of the present invention for data reclaim in a memory system in accordance with one embodiment of the present invention.

FIG. 9 illustrates a flowchart for an exemplary method for data reclaim from a memory system. The method illustrated in FIG. 9 begins at 901 by reading data from a memory using a preset voltage threshold based on a page type being read. At 903, the method continues by recording an initial set of program voltages for successful reads of the data from the memory. At 905, the method continues by determining an initial distribution of the initial set of program voltages. At 907, the method continues by recording over time subsequent sets of the program voltages for successful reads of the data from the memory. At 909, the method continues by determining subsequent distributions of the subsequent sets of the program voltages. At 911, the method continues by, based on program voltage variations of the subsequent distributions from the initial deviation, recycling the data in the memory.

In this method, the recycling may occur before a quality of service (QoS) requirement for the memory is violated. In this method, the program voltage variations of the subsequent distributions comprise an evolution from a concentrated distribution around the preset voltage threshold toward multiple dispersed voltage thresholds necessary for successful decoding of different pages of the memory.

In this method, at least one of a number of performance metrics associated with a capability of the controller to decode the data read from the memory can be tracked over time. The performance metrics may comprise at least one of a maximum fail bit count, a minimum fail bit count, a maximum number of decoding iterations, and a minimum number of decoding iterations.

In this method, the recycling may occur before a voltage variation, given by the following equation, is reached:

V=w0*(max(FBC)−min(FBC))+w1*(max(FBC(0to1)−min(FBC(0to1))+w2*(max(FBC(1to0))−min(FBC(1to0))+w3*(max(decoding iter)−min(decoding iter)), where V is the voltage variation, FBC is the failed bit count, w0, w1, w2, w3, etc. are the scaling factors, and "0to1" is the number of failed bits from value 0 to value 1 (0-->1).

In this method, the performance metrics may be tracked for every memory block of the memory being read. The evolution may be tracked from a time of manufacture of the memory. Also, the evolution may be tracked from a time of power-up of the memory.

In this method, the recycling may comprise rewriting original data back to the memory.

In another embodiment of the present invention, there is provided a memory system for data reclaim. The memory system (such as for example the memory system 10 in FIGS. 1 and 2) has a memory (such as for example the memory blocks 211 in FIG. 2); and a memory controller (such as for example the control circuit 220 in FIG. 2) in communication with the memory. The memory controller is configured to read data from the memory using a preset voltage threshold based on a page type being read; record an initial set of program voltages for successful reads of the data from the memory; determine an initial distribution of the initial set of program voltages; record over time subsequent sets of the program voltages for successful reads of the data from the memory; determine subsequent distributions of the subsequent sets of the program voltages; and based on program voltage variations of the subsequent distributions from the initial deviation, recycle the data in the memory.

In this system, the data in the memory may be recycled before a quality of service (QoS) requirement for the memory is violated. In this system, the program voltage variations of the subsequent distributions may comprise an evolution from a concentrated distribution around the preset voltage threshold toward multiple dispersed voltage thresholds necessary for successful decoding of different pages of the memory.

In this system, the controller can be configured to track at least one of a number of performance metrics associated with a capability of the controller to decode the data read from the memory. In this system, the performance metrics may comprise at least one of a maximum fail bit count, a minimum fail bit count, a maximum number of decoding iterations, and a minimum number of decoding iterations.

In this system, the data may be recycled before a voltage threshold, given by the following equation, is reached:
$V = w_0*(\max(FBC) - \min(FBC)) + w_1*(\max(FBC(0to1)) - \min(FBC(0to1))) + w_2*(\max(FBC(1to0)) - \min(FBC(1to0))) + w_3*(\max(\text{decoding iter}) - \min(\text{decoding iter}))$, where V is the voltage variation, FBC is the failed bit count, $w_0$, $w_1$, $w_2$, $w_3$, etc. are the scaling factors, and "0to1" is the number of failed bits from value 0 to value 1 (0-->1).

In this system, the performance metrics may be tracked for every memory block of the memory being read. The evolution may be tracked from a time of manufacture of the memory. The evolution may be tracked from a time of power-up of the memory.

In this system, the memory may be recycled by rewriting original data back to the memory.

Although the foregoing embodiments have been described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "system" or "processor" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations, one or more features from a combination can in some cases be excised from the combination, and the combination may be directed to a sub-combination or variation of a sub-combination.

What is claimed is:

1. A memory system for data reclaim, comprising:
a memory; and
a memory controller in communication with the memory, wherein the memory controller is configured to:
read data from the memory using a preset voltage level based on a page type being read;
record an initial set of program voltages comprising read biases for successful reads of the data from the memory;
determine an initial distribution of the read biases of the initial set of program voltages resulting in the successful reads of the data from the memory;
record over time subsequent sets of the program voltages for the successful reads of the data from the memory;
determine subsequent distributions of the read biases of the subsequent sets of the program voltages; and
based on read bias voltage variations of the read biases for the successful reads betweenof the subsequent distributions and the initial deviation, determine whether to recycle the data in the memory.

2. The memory system of claim 1, wherein the data in the memory is recycled before a quality of service (QOS) requirement for the memory is violated.

3. The memory system of claim 2, wherein the program-read bias voltage variations of the subsequent distributions comprise an evolution from a concentrated distribution around the preset voltage threshold toward multiple dispersed voltage thresholds necessary for successful decoding of different pages of the memory.

4. The memory system of claim 3, wherein the controller is configured to track at least one of a number of performance metrics associated with a capability of the controller to decode the data read from the memory.

5. The memory system of claim 4, wherein the performance metrics comprise at least one of a maximum fail bit count, a minimum fail bit count, a maximum number of decoding iterations, and a minimum number of decoding iterations.

6. The memory system of claim 4, wherein the data is recycled before a voltage variation, given by the following equation, is reached:

$$V = w0*(\max(FBC) - \min(FBC)) + w1*(\max(FBC(0 \text{ to } 1) - \min(FBC(0 \text{ to } 1)))) + w2*(\max(FBC(1 \text{ to } 0) - \min(FBC(1 \text{ to } 0)))) + w3*(\max-\min(\text{decoding iter})-\min(\text{decoding iter})),$$

where V is the voltage variation, FBC is the failed bit count, w0, w1, w2, and w3 are the scaling factors, and "0to1" is the number of failed bits from value 0 to value 1.

7. The memory system of claim 6, wherein the performance metrics are tracked for every memory block of the memory being read.

8. The memory system of claim 4, wherein the evolution is tracked from a time of manufacture of the memory.

9. The memory system of claim 4, wherein the evolution is tracked from a time of power-up of the memory.

10. The memory system of claim 1, wherein the memory is recycled by rewriting original data back to the memory.

11. A method for data reclaim in a memory system, comprising:
reading data from a memory using a preset voltage level based on a page type being read;
recording an initial set of program voltages comprising read biases for successful reads of the data from the memory;
determining an initial distribution of the read biases of the initial set of program voltages resulting in the successful reads of the data from the memory;
recording over time subsequent sets of the program voltages for successful reads of the data from the memory;
determining subsequent distributions of the read biases of the subsequent sets of the program voltages; and
based on read bias voltage variations of the read biases for the successful reads between the subsequent distributions and the initial deviation, determining whether to recycle the data in the memory.

12. The method of claim 11, wherein the recycling occurs before a quality of service (QOS) requirement for the memory is violated.

13. The method of claim 12, wherein the read bias voltage variations of the subsequent distributions comprise an evolution from a concentrated distribution around the preset voltage threshold toward multiple dispersed voltage thresholds necessary for successful decoding of different pages of the memory.

14. The method of claim 13, wherein the recording over time comprises tracking at least one of a number of performance metrics associated with a capability of the controller to decode the data read from the memory.

15. The method of claim 14, wherein the performance metrics comprise at least one of a maximum fail bit count, a minimum fail bit count, a maximum number of decoding iterations, and a minimum number of decoding iterations.

16. The method of claim 14, wherein the recycling occurs before a voltage variation, given by the following equation, is reached:

$$V = w0*(\max(FBC) - \min(FBC)) + w1*(\max(FBC(0 \text{ to } 1) - \min(FBC(0 \text{ to } 1)))) + w2*(\max(FBC(1 \text{ to } 0)-\min(FBC(1 \text{ to } 0)))) + w3*(\max-\min(\text{decoding iter})-\min(\text{decoding iter})),$$

where V is the voltage variation, FBC is the failed bit count, w0, w1, w2, and w3 are the scaling factors, and "0 to 1 " is the number of failed bits from value 0 to value 1.

17. The method of claim 14, further comprising tracking the performance metrics for every memory block of the memory being read.

18. The method of claim 14, wherein the evolution is tracked from a time of manufacture of the memory.

19. The method of claim 14, wherein the evolution is tracked from a time of power-up of the memory.

20. The method of claim 11, wherein the recycling comprises rewriting original data back to the memory.

* * * * *